United States Patent [19]

Murayama et al.

[11] Patent Number: 4,750,042
[45] Date of Patent: Jun. 7, 1988

[54] SOLID STATE IMAGE PICKUP ELEMENT WITH DUAL HORIZONTAL TRANSFER SECTIONS

[75] Inventors: Jin Murayama; Takashi Miida, both of Kanagawa, Japan

[73] Assignee: Fuji Photo Film Co., Ltd., Kanagawa, Japan

[21] Appl. No.: 2,330

[22] Filed: Jan. 12, 1987

[30] Foreign Application Priority Data

Jan. 10, 1986 [JP] Japan ................................. 61-2137

[51] Int. Cl.$^4$ .............................................. H04N 3/14
[52] U.S. Cl. ............................ 358/213.31; 358/213.23
[58] Field of Search ....................... 358/213.23, 213.26, 358/213.29, 213.31; 357/24 LR; 358/212

[56] References Cited

U.S. PATENT DOCUMENTS

| | | | |
|---|---|---|---|
| 4,528,594 | 7/1985 | Kadekodi et al. | 358/213.23 |
| 4,593,319 | 6/1986 | Kadedodi et al. | 358/213.26 |
| 4,617,595 | 10/1986 | Berger | 358/213.26 |

*Primary Examiner*—Jin F. Ng
*Assistant Examiner*—Stephen Brinich
*Attorney, Agent, or Firm*—Sughrue, Mion, Zinn, Macpeak, and Seas

[57] ABSTRACT

A horizontal transfer section for a solid state image-pickup matrix, in which the parallel signals are first read by a first horizontal CCD. A second horizontal CCD is aligned in parallel with the first one and having a deeper potential well. A gate electrode separates the two CCDs. Thereby, the gate electrode can transfer charges from the first to the second CCD and the first CCD can be refilled with different signals. The two horizontal CCDs can be serially read out by common clocking signals.

5 Claims, 1 Drawing Sheet

SOLID STATE IMAGE PICKUP ELEMENT WITH DUAL HORIZONTAL TRANSFER SECTIONS

BACKGROUND OF THE INVENTION

1. Field of the Invention

The present invention relates to a solid state image-pickup element, and particularly relates to a solid state image-pickup element in which multi-line reading-out is facilitated.

2. Background of the Invention

One of the trends of the present technical development of solid state image-pickup elements is the increase in picture elements to obtain high resolving power. A solid state image-pickup element in the class of 400,000 picture elements is available on the market.

As the picture elements are increased in number, fine workability and a high-speed operation characteristic are more and more required. As an example of measures to meet these requirements, a multi-line reading-out type solid state image-pickup elements has been provided which has been improved by using a plurality of horizontal CCDs connected in parallel with each other through a gate electrode.

However, such an element has a disadvantage that it is complicated to distribute signal charges from a vertical transfer portion to the plural horizontal CCDs. Further, the disadvantage has caused complication in pattern forms as well as in driving waveforms or has required high accuracy in mask registration in its manufacturing process.

SUMMARY OF THE INVENTION

It is an object to eliminate the disadvantages in the prior art.

More particularly, it is an object of the present invention is to provide a solid state image-pickup element in which multi-line reading-out can be carried out easily without using complicated pattern forms and driving waveforms and without complicating the manufacturing process.

In order to achieve the above-mentioned objects, according to the present invention, the solid state image-pickup element for reading out signals of photoelectric conversion elements arranged in a matrix is read by successively transferring the signals into a horizontal transfer portion constituted by at least two horizontal CCDs connected in parallel with each other through a gate electrode. According to the invention, respective potential wells of embedded channels in the horizontal CCDs are made different in depth from each other and the gate electrode is controlled so that signals transferred from a vertical transfer portion are distributed to the horizontal CCDs.

Thus, according to the present invention, the potential wells of the respective horizontal CCDs are formed to differing depths, so that a signal supplied to one horizontal CCD can be transferred to another horizontal CCD under the control of the gate electrode provided between the horizontal CCDs to thereby easily carry out signal distribution.

Other features and advantages of the invention will be apparent from the following description taken in connection with the accompanying drawings.

DETAILED DESCRIPTION OF THE PRFERRED EMBODIMENT

Figure 1:
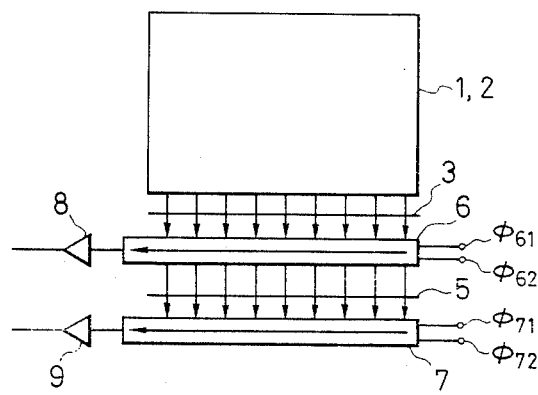
FIG. 1 is a block diagram showing an embodiment of the solid state image-pickup element according to the present invention.

Referring to the drawings, an embodiment of the present invention will be described hereunder.

FIG. 1 is a block diagram showing an embodiment of the solid state image-pickup element according to the present invention. In the embodiment, description will be made as to a case in which two horizontal charge-coupled devices (HCCD) connected in parallel with each other are driven in two phases.

In the drawing, a light receiving portion 1 and a vertical transfer portion 2 are simply shown as one block. That is, there are provided the light receiving portion 1 constituted by a plurality of light receiving elements arranged in matrix, and the vertical transfer portion 2 constituted by vertical CCDs corresponding to the vertical rows of the light receiving elements. Each element of a vertical CCD receives a signal from a respective light receiving element. A horizontal transfer portion which will be described later is arranged at the output side of the vertical transfer portion 2 through a gate electrode 3.

The horizontal transfer portion is constituted by two HCCDs 6 and 7 connected in parallel with each other through a gate electrode 5 and connected at their output ends with buffer amplifiers 8 and 9 respectively. The HCCDs 6 and 7 are driven by a number of horizontal transfer electrodes arranged in a plurality of pairs ($10_1$ and $11_1$, $10_2$ and $11_2$, … $10_n$ and $11_n$ in FIG. 3) with two clock signals $\phi_{61}$, $\phi_{62}$ and $\phi_{71}$, $\phi_{72}$ for each of the HCCDs 6 and 7 controlling the horizontal transfer electrodes. The respective pairs of clock signals are connected to alternating ones of the respective horizontal transfer electrodes $10_1$–$10_n$ or $11_1$–$11_n$. Channel isolation regions 13 are aligned with the data cells of the two HCCDs 6 and 7. The lines of the vertical transfer portion 2 are aligned with the horizontal transfer electrodes $10_2$, $10_4$, … $10_n$ and $11_2$, $11_4$, … $11_n$ and these horizontal transfer electrodes are biased to produce a potential well for reading from the vertical transfer portion.

Figure 2:
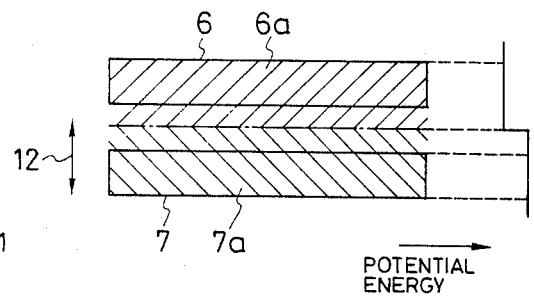
FIG. 2 is a view for explaining potential profiles of the two horizontal CCDs in the embodiment of FIG. 1.

FIG. 2 is a view for explaining the feature of the present invention and shows potential profiles of the two HCCDs 6 and 7.

As is apparent from the drawing, according to the present invention, there is provided a difference in depth of the potential well (potential energy) between respective embedded channels 6a and 7a of the two HCCDs 6 and 7. The difference is accomplished by making the impurity concentration higher in a first region (designated by 12 in FIG. 3) including the embedded channel 7a, at the lower side of the transfer portion formed between the HCCDs, higher than that in a second region including the other embedded channel 6a at the upper side of the same transfer portion. This higher impurity concentration makes the depth of the potential well deeper in the first region 12 than that in the second one even under the condition of the same gate voltage.

That is, in a CCD, the voltage applied to a gate electrode is successively changed between HIGH and LOW to change the depth of the potential well to thereby successively transfer charges stored in the potential well. It is well known that the depth of a potential well is formed depending on the impurity concentration. According to the present invention, therefore, a difference in a stationary state is previously formed by means of an impurity concentration difference between the two HCCDs 6 and 7 so as to provide a difference in depth between the respective potential wells. As a result, the charges transferred to the horizontal transfer portion can be simply distributed.

The difference in depth between the wells can be achieved, for example, by carrying out n-type diffusion twice in the embedded channels. That is, for example, when ion-injection is performed with arsenic (As) as an n-type impurity, arsenic (As) is first injected into substrate all over the embedded channel portions and then arsenic (As) is again injected only into a region in which is desired to increase the channel impurity concentration. Specifically in the embodiment of the present embodiment, the second injection is performed into the lower region 12 including the HCCD 7.

Because the absolute value of the impurity concentration is a well known one, its description will be omitted here.

Next, the operation of the thus arranged solid state image-pickup element according to the present invention will be described.

When an image of a subject is focused on the light receiving portion 1 and charges corresponding to the luminance of the subject are obtained, the charges are transferred by the vertical transfer portion 2 to the horizontal transfer portion through the gate electrode 3. At that time, for example, the charges of an odd field selected by interlaced scanning are first transferred into the embedded channel 6a of the upper HCCD 6 shown in FIGS. 2 and 3. Next, the charges of the odd field are transferred to the embedded channel 7a of the lower HCCD 7 through the upper HCCD 6 by means of the gate electrode 5 which is provided between the two HCCDs 6 and 7 and which is set to a H level to be conducted at the same time when the charges are transferred into the embedded channel 6a. This state is shown in FIG. 4.

Figure 4:
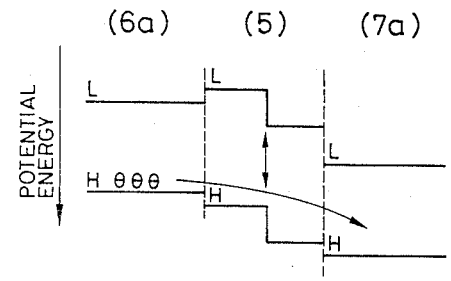
FIG. 4 is a view showing a state of charge transfer between the two horizontal CCDs.

A lower line in FIG. 4 shows the state in which the gate electrode 5 between the HCCDs 6 and 7 assumes the H level to be conductive (the lowered position in the drawing) and the charges stored in the upper embedded channel 6a is transferred to the lower deep position 7a of the potential well.

Figure 3:
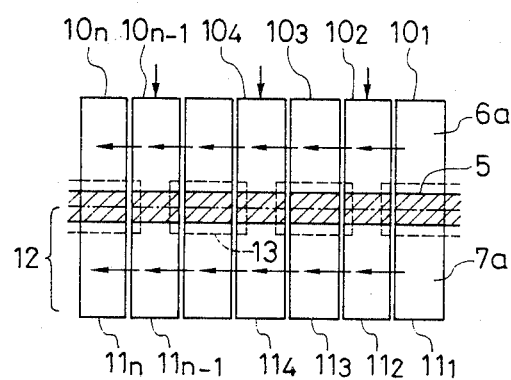
FIG. 3 is a view for explaining a main portion and operation according to the present invention.

On the other hand, at a point in time when the charges of an even field next selected are transferred into the horizontal transfer portion, the gate electrode 5 is set to the L-level (the upper position in FIG. 4) so that the charges are transferred into the upper embedded channel 6a (HCCD 6) to be stored. At that time, the gate electrode 5 operates as a channel barrier (upper position of FIG. 4) to prevent the charges from flowing into the lower channel 7a. Thus, the signal charges transferred from the vertical transfer portion 2 are distributed to both the HCCDs 6 and 7. The charges are then successively horizontally transferred by the respective horizontal transfer electrodes $10_1$–$10_n$ and $11_1$–$11_n$ as shown in FIG. 3, and then supplied to a recording device or a display device (both not shown) through the respective buffer amplifiers 8 and 9. At that time, according to the present invention, the charges distributed to the respective HCCDs 6 and 7 can be independently transferred without interfering with each other so that the horizontal transfer electrodes 10 and 11 can be driven by the same clock signals, that is, $\phi_{61}=\phi_{71}$ and $\phi_{62}=\phi_{72}$, at the same pulse timing with the same voltage.

Although the depth of the potential well is realized by virtue of the change in impurity concentration in the described embodiment, the depth may be alternatively realized owing to the change, for example, in the thickness of the oxide films on the respective channels.

Further, although two-line reading-out by two HCCDs has been described in the embodiment, it will be apparent to those skilled in the art that the present invention is not limited to this, but three-line reading-out may be carried out, and the HCCDs may be driven by any driving system with two phases, three phases, or four phases.

As described above, according to the solid state image-pickup element of the present invention, a difference in potential level is provided between the HCCDs for performing multi-line reading-out, so that the charges transferred from the vertical transfer portion can be easily distributed to the HCCDs by only controlling the gate electrode between the HCCDs. Because the charges of the HCCDs can be independently transferred without interfering with each other, the transfer gate electrodes can be used commonly to facilitate the driving of the HCCDs. Further, between the HCCDs, there is provided only a difference in potential level and besides the difference can be easily formed, for example, by only carrying out one additional ion diffusion, without making the manufacturing process complicated. The boundary between the potential levels may be formed at any position so long as the position is under the gate electrode between the HCCDs, so that high accuracy is not required in mask registration.

What is claimed is:

1. A solid state image pickup element, comprising:
a plurality of photoelectric conversion elements arranged in a matrix;
a plurality of lines each receiving signals from a column of said matrix and transferring signals to a horizontal transfer section, said horizontal transfer section comprising:
two parallel horizontal CCDs each having a plurality of elements receiving signals in an embedded channel, the elements of a first one of said CCDs receiving said signals from corresponding ones of said lines, wherein a stationary state potential well of said embedded channel of one of said CCDs has a differing potential level from a stationary state potential well of said embedded channel of the other of said CCDs; and
a gate electrode arranged between said CCDs for gating signals from said elements of said first one of said CCDs to corresponding elements of a second one of said CCDs.

2. A solid state image-pickup element as recited in claim 1, further comprising means for controlling said gate electrode to gate said signals from said matrix through said first one of said CCDs to said second one of said CCDs.

3. A solid state image-pickup device as recited in claim 2, wherein said imbedded channel of said first one of said CCDs has a different doping concentration than said embedded channel of said second one of said CCDs.

4. A solid state image-pickup device as recited in claim 3, wherein said two different doping concentrations extend beneath said gate electrode.

5. A solid state image-pickup device as recited in claim 3, further comprising:
   horizontal transfer electrodes disposed over said elements of said two CCDs; and
   means for controlling said horizontal transfer electrodes of both of said CCDs with common timing signals.

* * * * *